United States Patent [19]

Sumi et al.

[11] 4,437,021
[45] Mar. 13, 1984

[54] LINE DRIVER CIRCUIT

[75] Inventors: Hideji Sumi, Yokohama; Masayuki Kokado, Kawasaki, both of Japan

[73] Assignee: Fujitsu Limited, Kawasaki, Japan

[21] Appl. No.: 309,438

[22] Filed: Oct. 7, 1981

[51] Int. Cl.[3] .......................... H03K 3/33; H03K 3/01
[52] U.S. Cl. .................... 307/270; 307/494; 307/300
[58] Field of Search ............... 307/270, 271, 300, 494, 307/280, 455

[56] References Cited

U.S. PATENT DOCUMENTS

| 3,534,237 | 10/1970 | Ananiades | 307/270 |
| 3,553,601 | 1/1971 | Glasser | 307/270 |
| 4,131,808 | 12/1978 | Kuo | 307/270 |
| 4,132,906 | 1/1979 | Allen | 307/270 |
| 4,228,369 | 10/1980 | Anantha et al. | 307/270 |
| 4,286,179 | 8/1981 | Konian et al. | 307/270 |

*Primary Examiner*—Stanley D. Miller
*Assistant Examiner*—B. P. Davis
*Attorney, Agent, or Firm*—Staas & Halsey

[57] ABSTRACT

A line driver circuit for driving a unit located a long distance away through a long transmission line, comprising an output stage having an emitter follower including transistors in which an output-stage transistor provides an output signal of a high potential or a low potential in response to the electric potential of an input signal. A discharge pass is connected to the base of the output-stage transistor, for drawing charges on the base of the output-stage transistor off thereof and thus shortening the fall time of the output waveform.

9 Claims, 5 Drawing Figures

4,437,021

LINE DRIVER CIRCUIT

BACKGROUND OF THE INVENTION

1. Field of the Invention

The present invention relates to a line driver circuit comprising an emitter follower at the output stage, with the fall time of the output signal of the emitter follower being shortened.

The line driver circuit is used to transmit signals from, for example, a terminal unit, through a transmission line with a length of several tens of meters or several hundred meters, to a computer a long distance away. The output stage of the line driver circuit includes an emitter follower made of transistors. In order to transmit signals over such a long distance, the line driver circuit has to have a large driving capacity. Therefore, the size of the transistors in the emitter follower must be relatively large. The fall time of the output signal of an emitter follower is essentially long in comparison with other transistor logic circuits. When the size of the transistors in the emitter follower is increased, the capacitance between the base and the emitter of each of the respective transistors is also increased and, accordingly, the fall time of the output signal is further elongated, resulting making it difficult to achieve a high-speed operation.

2. Description of the Prior Art

In conventional line driver circuits, there is a disadvantage in that the fall time of the output signal is too long to drive the transmission line at a desired high speed.

SUMMARY OF THE INVENTION

Accordingly, an object of the present invention is to provide a line driver circuit which can realize a high speed operation.

Another object of the present invention is to provide a line driver circuit having a short fall time of the output signal, in comparison with the conventional line driver circuit.

Still another object of the present invention is to provide a line driver circuit in which the output-stage transistor in an emitter follower gives an output signal having a short fall time, in comparison with the conventional line driver circuit.

According to the present invention, there is provided a line driver circuit which includes a differential pair of transistors having a first transistor for receiving an input signal and a second transistor for receiving a reference signal, these transistors being exclusively turned on and off in response to the potential of the input signal; an output stage having an emitter follower in which the output-stage transistor provides an output signal of a high potential or a low potential in response to the output potential of the differential pair; and a discharge path for drawing charges from the base of the output-stage transistor in the emitter follower, through one of the transistors in the differential pair, when the output-stage transistor in the emitter follower is turned from on to off.

These and other objects and advantages of the present invention will be more apparent from the following description of the preferred embodiments with reference to the accompanying drawings.

DESCRIPTION OF THE PREFERRED EMBODIMENT OF THE INVENTION

Figure 1:
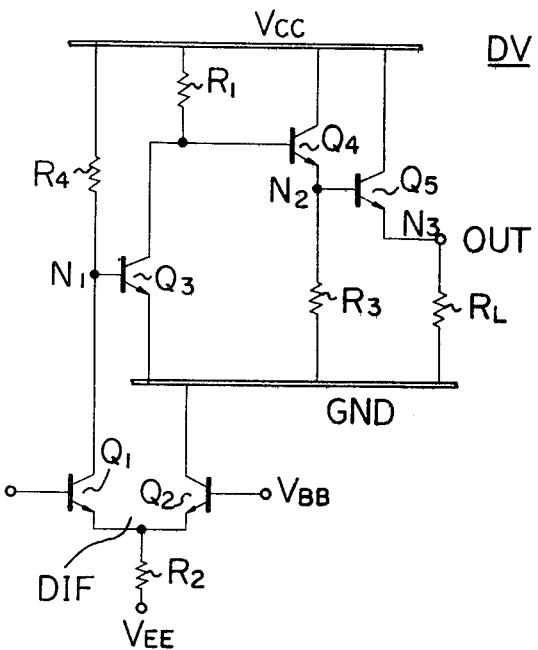
FIG. 1 is a circuit diagram illustrating a conventional line driver circuit.
Figure 2:
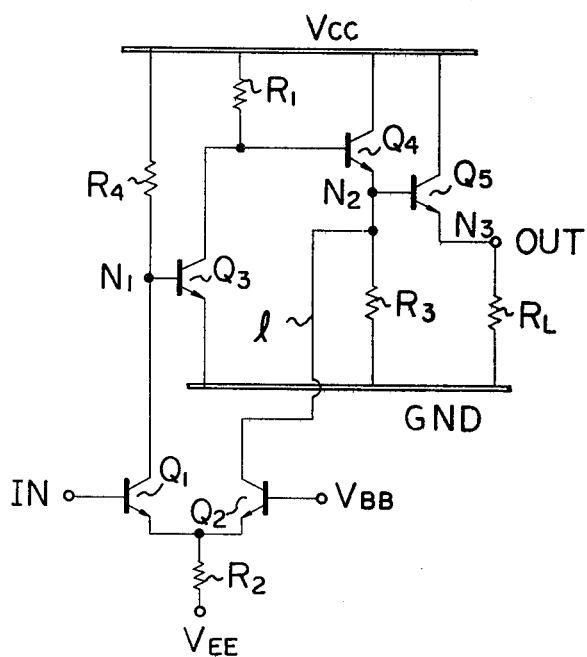
FIG. 2 is a circuit diagram illustrating a line driver circuit according to an embodiment of the present invention.

FIGS. 1 and 2 are circuit diagrams illustrating a conventional line driver circuit and a line driver circuit according to an embodiment of the present invention, respectively. Referring to FIGS. 1 and 2, a line driver circuit DV of a level-converting type for converting an ECL level signal to a TTL level signal is illustrated. An input terminal IN receives an input signal which has two values, i.e., a high potential (hereinafter referred to as an H level) of zero volts (ground level) and a low potential (hereinafter referred to as an L level) of a negative voltage $V_{EE}$. The input terminal IN is connected to the base of a first transistor $Q_1$. The base of a second transisor $Q_2$ is connected to a reference terminal for receiving a reference voltage $V_{BB}$ which has a value between the H level and the L level. The collector of the first transistor $Q_1$ is connected through a pull-up resistor $R_4$ to a power supply line $V_{CC}$. The first transistor $Q_1$, the second transistor $Q_2$, and the resistor $R_2$ constitute a differential pair DIF. When the input terminal IN receives an input signal of the H level, the first transistor $Q_1$ is on and the second transistor $Q_2$ is off. When the input terminal IN receives an input signal of the L level, the first transistor $Q_1$ is off and the second transistor $Q_2$ is on. The collector of the first transistor $Q_1$ is also connected to the base of a transistor $Q_3$. The collector of the transistor $Q_3$ is connected through a pull-up resistor $R_1$ to the power supply line $V_{CC}$ and is also connected to the base of a transistor $Q_4$. The emitter of the transistor $Q_3$ is connected to the ground line GND. The collector of the transistor $Q_4$ is connected to the power supply line $V_{CC}$. The emitter of the transistor $Q_4$ is connected to the base of a transistor $Q_5$. The base of the transistor $Q_5$ is connected through a pull-down resistor $R_3$ to the ground line GND. The collector of the transistor $Q_5$ is connected to the power supply line $V_{CC}$. The emitter of the transistor $Q_5$ is connected to the output terminal OUT. Between the output terminal OUT and the ground line GND, a load resistor $R_L$ is connected. In FIG. 1, the collector of the second transistor $Q_2$ is connected to the ground line GND. In contrast, in the FIG. 2 embodiment of the present invention, the collector of the second transistor $Q_2$ is connected through a discharge path 1 to the base of the transistor $Q_5$. The two transistors $Q_4$ and $Q_5$ constitute a two-stage emitter follower. The transistor $Q_3$ drives the emitter follower in response to the potential at the collector of the first transistor $Q_1$, i.e., at a node $N_1$. These transistors $Q_3$ through $Q_5$ are operated by the positive power supply $V_{CC}$.

The operation of the circuits of FIGS. 1 and 2 will now be explained. When the input terminal IN receives an input signal of the H level, the potential at the collector of the transistor $Q_1$ is at the L level so that the transistor $Q_3$ is in an off state, and accordingly, the transistor $Q_4$ is in an on state because its base receives current from the power supply line $V_{CC}$ through the pull-up resistor $R_1$, resulting in the H level at the emitter of the transistor $Q_4$, i.e., at the node $N_2$. Therefore, the output-stage transistor $Q_5$ is turned on so that the potential at the output terminal OUT connected to the emitter of the transistor $Q_5$ becomes the H level. In contrast, when the input terminal IN receives an input signal of the L level, the transistor $Q_1$ is turned off so that the potential at the base of the transistor $Q_3$, i.e. at the node $N_1$ is pulled up to the H level by the resistor $R_4$, resulting in the transistor $Q_3$ being turned on. As a result, the potential at the base of the transistor $Q_4$ becomes the L level so that the potential at the nodes $N_2$ and $N_3$ become L level.

In order to make the potential at the output terminal OUT to the L level, the potential at the base of the transistor $Q_5$, i.e., at the node $N_2$, must be turned to the L level. In the conventional circuit illustrated in FIG. 1, when the potential at the input terminal IN changes from the H level to the L level, that is, when the transistor $Q_5$ switches from on to off, charges on the base of the transistor $Q_5$ are drawn through a path, including the node $N_2$ and the pull-down resistor $R_3$, to the ground line GND. Due to the pull-down resistor $R_3$, the discharge time constant is so large that the fall time of the potential at the output terminal OUT is too long.

In contrast, according to one embodiment of the present invention, the base of the transistor $Q_5$ is connected through the discharge path 1 to the collector of the second transistor $Q_2$, as illustrated in FIG. 2. By this connection, when the potential at the input terminal IN changes from the H level to the L level, charges on the base of the transistor $Q_5$ are rapidly drawn through the discharge path 1, the second transistor $Q_2$ (which is in an on state at this timing), and the resistor $R_2$ to the negative voltage source $V_{EE}$. Therefore, the fall time of the potential at the output terminal OUT is shortened in comparison with the conventional circuit.

Figure 3:
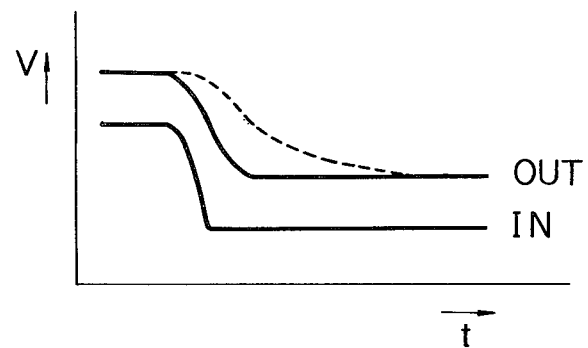
FIG. 3 is a graph illustrating the fall-time characteristics of the respective line driver circuits of FIGS. 1 and 2.

FIG. 3 is a graph illustrating the fall-time characteristics of the line driver circuits of FIGS. 1 and 2. In FIG. 3, output waveforms of the conventional circuit of FIG. 1 and the circuit of the embodiment of the present invention of FIG. 2 are illustrated by a dotted curve and a solid curve, respectively. As will be seen from FIG. 3, in response to a fall of the input signal, the output signal, according to the FIG. 2 embodiment of the present invention, falls more rapidly than the conventional output signal does.

Figure 4:
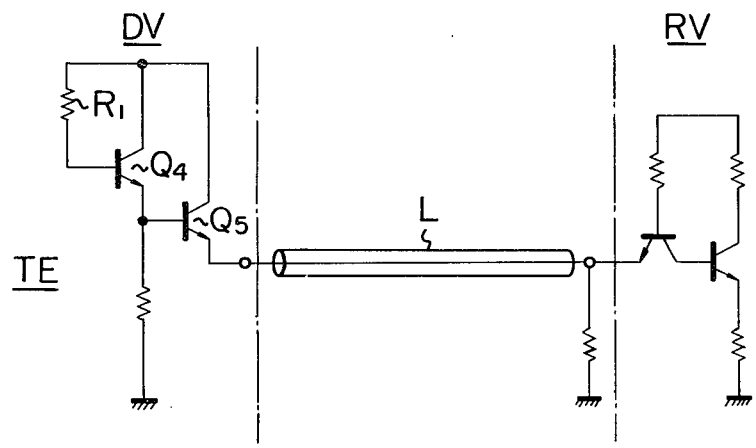
FIG. 4 is a circuit diagram illustrating an example of a system utilizing a line driver circuit; and, FIG. 5 is a circuit diagram illustrating a line driver circuit according to another embodiment of the present invention.

FIG. 4 is a circuit diagram illustrating an example of a system utilizing a line driver circuit. Referring to FIG. 4, TE represents a terminal unit having at its output stage the line driver circuit DV; RV represents a receiver circuit in a computer side; and L represents a transmission line connected between the line driver circuit and the receiver circuit. Only the emitter follower in the line driver circuit is illustrated in FIG. 4. The length of the transmission line L is several tens of meters to several thousand meters. The line driver circuit is formed as an integrated circuit.

Figure 5:
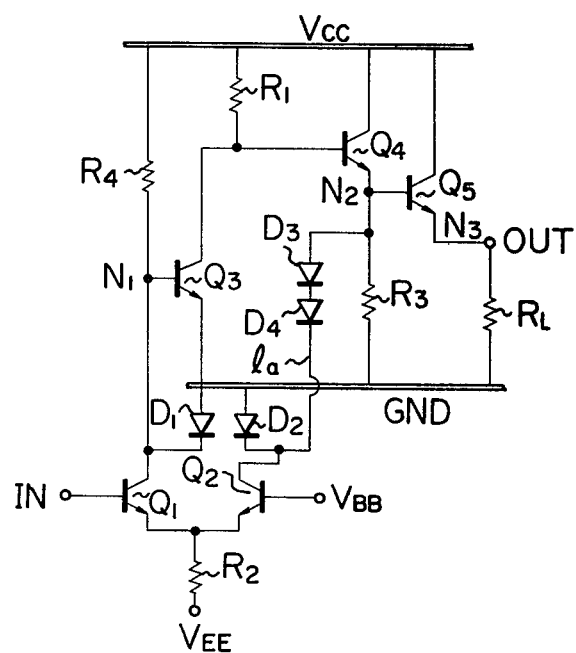

FIG. 5 is a circuit diagram illustrating a line driver circuit according to another embodiment of the present invention. The difference between the circuits of FIGS. 2 and 5 is that four diodes $D_1$ through $D_4$ are used in FIG. 5 but not used in FIG. 2. The anode of the diode $D_1$ is connected to the ground line GND. The cathode of the diode $D_1$ is connected to the collector of the first transistor $Q_1$. The diode $D_1$ acts to prevent the transistor $Q_1$ from being saturated. The anode of the diode $D_2$ is connected to the ground line GND. The cathode of the diode $D_2$ is connected to the collector of the second transistor $Q_2$. In place of the discharge path 1 in the circuit of FIG. 2, the two diodes $D_3$ and $D_4$ are connected in series between the base of the transistor $Q_5$ and the collector of the transistor $Q_2$. The two diodes $D_3$ and $D_4$ constitute a discharge path for drawing charges on the base of the transistor $Q_5$ when the potential at the node $N_2$ falls. The diode $D_2$ and the two diodes $D_3$ and $D_4$ constitute a current switch.

In operation, when the potential at the input terminal begins to fall from the H level to the L level, the first transistor $Q_1$ is turned off and the second transistor $Q_2$ is turned on. Then, the transistor $Q_3$ is turned on and the transistors $Q_4$ and $Q_5$ are turned off. Therefore, the potential at the node $N_2$ begins to fall. During this time, charges on the base of the transistor $Q_5$ are rapidly drawn through a discharge path $1a$ including the two diodes $D_3$ and $D_4$, the second transistor $Q_2$ which is in an on state, and the resistor $R_2$ to the negative voltage source $V_{EE}$, as well as through the pull-down resistor $R_3$ to the ground line GND, so that the potential at the output terminal OUT falls more rapidly in comparison with the conventional circuit. When the potential at the node $N_2$ reaches $V_{BE}$, where $V_{BE}$ represents the base-emitter voltage of the transistor $Q_5$ and the forward voltage of the diode $D_2$, $D_3$ or $D_4$, the potential at the output terminal OUT becomes zero volts, and also the two diodes $D_3$ and $D_4$ are cut off. Therefore, when the potential at the node $N_2$ is lower than $V_{BE}$, the charges are not drawn from the base of the transistor $Q_5$. When the potential at the input terminal IN is the H level, the second transistor $Q_2$ is at an off state so that the charges are not drawn. Thus, the charge drawing through the two diodes $D_3$ and $D_4$ is executed only when the potential at the base of the transistor $Q_5$, i.e., at the node $N_2$, is lower than the H level but is higher than $V_{BE}$. As a result, according to this second embodiment, in a normal state in which the potential at the output terminal OUT is the H level or the L level, no current is conducted through the two diodes $D_3$ and $D_4$ so that the output waveform is not subjected to distortion.

From the foregoing description, it will be apparent that, according to the present invention, because a rapidly discharging path is connected to the base of the transistor in the emitter follower in the output stage of the line driver circuit, the fall time of the output waveform can be shortened, even when the size of the transistors in the emitter follower is increased for improving the driving capacity. Also, by employing a current switch in the discharge path, discharge is effected only during the transition period from the H level to the L level of the output signal, so that the output waveform is not deteriorated in a normal state. As a result, the line driver circuit according to the present invention can drive a computer a long distance away at a high speed.

The present invention is not restricted to the foregoing embodiments; there may be various modifications without departing from the scope of the invention.

We claim:

1. A line driver circuit comprising:

a differential pair of transistors having a first transistor for receiving an input signal and a second transistor for receiving a reference signal, said first and second transistors being exclusively turned on and off in response to the electric potential of the input signal;

an output stage having an emitter follower including a plurality of transistors in which an output-stage transistor provides an output signal of a high potential or a low potential in response to the output potential of the differential pair; and a discharge path means for drawing charges accumulated on the base of the output-stage transistor in the emitter follower, through one of the transistors in the differential pair, when the output-stage transistor in the emitter follower is turned from ON to OFF, wherein said discharge path means comprises current switch means, having at least one diode between the base of said output-stage transistor and the collector of said one of the transistors in said differential pair, for cutting off said discharge path means when the voltage between the base and the emitter of said output-stage transistor is equal to or lower than the threshold voltage for turning on said output-stage transistor.

2. A line driver circuit as set forth in claim 1, wherein said current switch means comprises two series-connected diodes inserted between the base of said output-stage transistor and the collector of said one of the transistors in said differential pair, and further comprising a diode connected between a ground line and the collector of said one of the transistors in said differential pair.

3. A line driver circuit as set forth in claim 2, wherein said line driver circuit further comprises a driving transistor means for driving said emitter follower in response to the turning ON or OFF of said first transistor.

4. A line driver circuit as set forth in claim 1, 2, or 3, wherein said discharge path means is connected between the base of said output-stage transistor and the collector of said second transistor.

5. A line driver circuit comprising:

transistors forming a differential circuit including one transistor receiving an input signal and another transistor receiving a reference signal, said transistors being turned on and off in response to the input signal;

an emitter follower output stage having several transistors including an output-stage transistor for providing an output signal of a high potential or a low potential in response to the output potential of the differential circuit; and means for drawing charges accumulated on the base of the output-stage transistor of the emitter follower through one of the transistors of the differential circuit when the output-stage transistor is turned from ON to OFF, said means including a connection between the base of said output-stage transistor and the collector of one of the transistors of said differential circuit.

6. A line driver circuit as set forth in claim 5, wherein said connection is a direct one with no elements in series therewith.

7. A line driver circuit as set forth in claim 5, wherein said connection includes a plurality of diodes in series therewith.

8. A line driver circuit as set forth in claim 7, wherein another diode is connected between the collector of said one transistor and a ground line.

9. A line driver circuit as set forth in claim 8, wherein a resistor is connected between the base of said output-stage transistor and the ground line.

* * * * *

UNITED STATES PATENT AND TRADEMARK OFFICE
CERTIFICATE OF CORRECTION

PATENT NO. : 4,437,021

DATED : Mar. 13, 1984

INVENTOR(S) : Sumi et al.

It is certified that error appears in the above-identified patent and that said Letters Patent is hereby corrected as shown below:

Front page, insert:
    --[30] Foreign Application Priority Data
      Oct. 8, 1980 [JP] Japan ..... 55-141038--.

Column 1, line 27, delete "resulting";
Column 1, line 30, "diad-" should be -- disad- --.
Column 2, line 62, "1" should be --$\ell$--.
Column 3, line 35, "1" should be --$\ell$--;
Column 3, line 40, "1" should be --$\ell$--;
Column 3, line 41, "timing" should be --time--.
Column 4, line 9, "1" should be --$\ell$--;
Column 4, line 24, "1a" should be --$\ell$a--.

Signed and Sealed this

Sixth Day of November 1984

[SEAL]

Attest:

Attesting Officer

GERALD J. MOSSINGHOFF

Commissioner of Patents and Trademarks